United States Patent [19]

Kenkare et al.

[11] Patent Number: 5,369,052

[45] Date of Patent: Nov. 29, 1994

[54] METHOD OF FORMING DUAL FIELD OXIDE ISOLATION

[75] Inventors: Prashant Kenkare; James R. Pfiester; Shih-Wei Sun, all of Austin, Tex.

[73] Assignee: Motorola, Inc., Schaumburg, Ill.

[21] Appl. No.: 161,362

[22] Filed: Dec. 6, 1993

[51] Int. Cl.$^5$ .................................. H01L 21/76
[52] U.S. Cl. ............................ 437/70; 437/69; 437/72; 437/73; 437/979; 148/DIG. 116
[58] Field of Search ............. 437/69, 70, 72, 73, 437/979; 148/DIG. 116

[56] References Cited

U.S. PATENT DOCUMENTS

| | | | |
|---|---|---|---|
| 4,520,552 | 6/1985 | Kraft | 437/69 |
| 4,669,179 | 6/1987 | Weinberg et al. | 437/69 |
| 4,743,563 | 5/1988 | Pfiester et al. | 437/70 |
| 4,758,530 | 7/1988 | Schubert | 437/69 |
| 4,971,923 | 11/1990 | Nakanishi | 437/69 |
| 5,061,654 | 10/1991 | Shimizu et al. | 437/70 |
| 5,236,862 | 8/1993 | Pfiester et al. | 47/70 |

FOREIGN PATENT DOCUMENTS 0244627  10/1988  Japan ...................... 437/69

Primary Examiner—Brian E. Hearn
Assistant Examiner—Trung Dang
Attorney, Agent, or Firm—Minh-Hien N. Clark

[57] ABSTRACT

Dual field oxide isolation (34 & 42) is formed by oxidizing through a portion (44) of a silicon nitride layer (30), through an exposed portion (43) of a remaining portion (18) of a masking layer (16), and through an exposed portion (42) of a buffer layer (28), all of which overlie isolation regions (22) of the silicon substrate (12). The different portions vary the diffusion rate of oxygen so that different field oxide thicknesses are created in a single field oxidation cycle. Therefore, integrated circuits having both low voltage densely packed devices and high voltage devices can be fabricated on the same circuit.

20 Claims, 3 Drawing Sheets

METHOD OF FORMING DUAL FIELD OXIDE ISOLATION

CROSS-REFERENCE TO RELATED APPLICATION

This application is related, in part, to a commonly assigned, co-pending patent application by James R. Pfiester et al., entitled, "Method and Structure for Forming Electrical Isolation in an Integrated Circuit," Ser. No. 8/091,100, filed on Jul. 13, 1993.

FIELD OF THE INVENTION

This invention relates generally to semiconductor devices, and more specifically to a process for the formation of electrical isolation structures having dual thicknesses in a semiconductor integrated circuit.

BACKGROUND OF THE INVENTION

The combination of multiple functions on a single semiconductor chip is a growing trend in the development and manufacturing of advanced integrated circuits. For example, "Smart Power" applications involve the integration of power transistors with logic circuitry. A challenge with this approach is that the device requirements for power transistors are quite different as compared to the requirements for logic circuitry. Power transistors are relatively larger and operate at much higher voltages than transistors used in logic circuitry. In contrast, the logic devices are smaller and more densely packed. Hence, a semiconductor process allowing fabrication of both logic and power devices on the same integrated circuit is necessary. For example, the process needs to allow fabrication of different electrical isolation structures on the same chip.

Local oxidation of silicon (LOCOS) is the most commonly used isolation technology for silicon integrated circuits. In a standard LOCOS process, a thin layer of pad oxide is thermally grown on the surface of a silicon wafer. A silicon nitride layer is then deposited onto the pad oxide layer. The silicon nitride layer is then photolithographically patterned and etched to define active regions and isolation regions. Field oxide is then grown in the isolation regions, while the active regions, which are masked by the patterned silicon nitride layer, are protected from the oxidation process.

Various other modified LOCOS processes have also been proposed to fabricate electrical isolation structures. One approach uses a conformal layer of polysilicon to fill a cavity created by undercutting pad oxide layer lying underneath the silicon nitride oxidation mask. A second approach fills the cavity with a conformal layer of silicon nitride, which is then anisotropically etched to form a sidewall spacer adjacent to the silicon nitride filled cavity.

The limitation of all LOCOS-based processes is that only one field oxide thickness can be fabricated across the integrated circuit during a single field oxidation cycle. However, integration of multiple functions on the same semiconductor device requires an isolation process for creating different field oxide thicknesses, which is typically achieved with at least two field oxidation cycles. A process which requires multiple field oxidation cycles is more costly due to added steps and longer processing time.

SUMMARY OF THE INVENTION

The present invention provides, in one embodiment, a method for forming a dual field thickness isolation structure in an integrated circuit on a semiconductor substrate. A buffer layer is formed overlying the substrate. A first masking layer is formed overlying the buffer layer. The first masking layer is patterned to form a first exposed portion of the buffer layer and to define an isolation region of the substrate. The patterning process also leaves a remaining portion of the first masking layer overlying the substrate. A nitride layer is formed overlying the remaining portion of the first masking layer and the first exposed portion of the buffer layer. A second masking layer is formed overlying a portion of the nitride layer, wherein the second masking layer is patterned to form an exposed portion of the nitride layer. The exposed portion of the nitride layer is then removed to form a second exposed portion of the buffer layer and to form an exposed portion of the remaining portion of the first masking layer. A remaining portion of the nitride layer is protected by the second masking layer. The second masking layer is removed after the step of removing the exposed portion of the nitride layer. The remaining portion of the nitride layer and the second exposed portion of the buffer layer are oxidized to form an oxidized layer having the dual field thickness electrical isolation structure in the isolation region of the substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
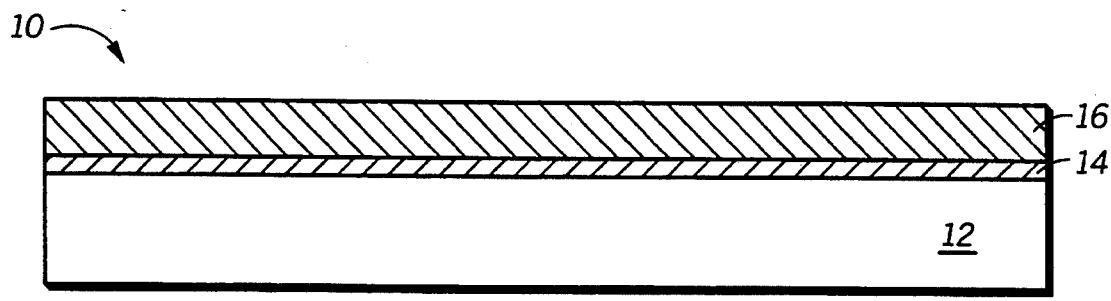
FIGS. 1-9 illustrate, in cross-section, process steps in accordance with one embodiment of the invention, wherein like reference numerals designate identical or corresponding parts throughout the several views.

FIGS. 1 through 9 illustrate, in cross-section, process steps in accordance with one embodiment of the invention wherein electrical isolation structures having a dual field thicknesses are formed in an integrated circuit. Shown in FIG. 1 is a portion 10 of an integrated circuit structure comprising a semiconductor substrate 12, a first buffer layer 14, and a first masking layer 16. Substrate 12 is preferably monocrystalline silicon. Alternatively substrate 12 may be silicon on an insulator, or silicon on sapphire, et cetera. Substrate 12 is preferably thermally oxidized to form first buffer layer 14, which may have a thickness ranging from 5 to 100 nanometers. Alternatively, first buffer layer 14 may be chemically vapor deposited silicon dioxide or a laminate of thermally grown and chemically vapor deposited silicon dioxide. Following the formation of first buffer layer 14, the first masking layer 16 is formed overlying first buffer layer 14. First masking layer 16 is preferably chemically vapor deposited silicon nitride and may have a thickness ranging from 50 to 300 nanometers. Alternatively, first masking layer 16 may also be a laminate of silicon nitride overlying polysilicon, or another material such as oxynitride.

Figure 2:
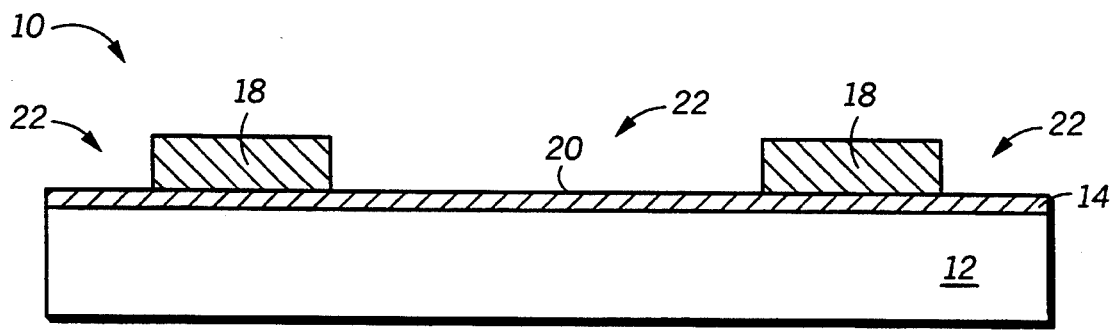

In FIG. 2, using conventional photolithographic patterning and etching techniques, first masking layer 16 is then patterned to leave a remaining portion 18 of the first masking layer overlying substrate 12. The patterning process also exposes a portion 20 of the first buffer layer 14 and defines isolation regions 22 of substrate 12. Additionally, after the patterning process, isolation region 22 may be doped using a diffusion or implantation step.

Figure 3:
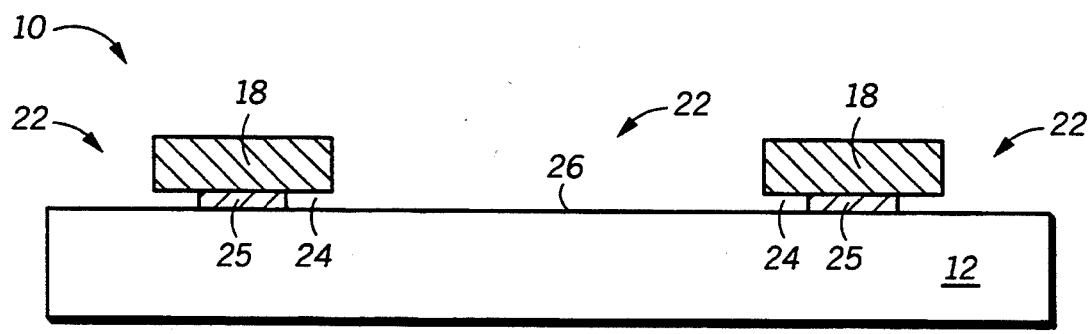

In FIG. 3, the exposed portion of the first buffer layer is then selectively and isotropically etched to form a recess 24 under an edge portion of remaining portion 18 of the first masking layer. The etching process also leaves a remaining portion 25 of the first buffer layer overlying substrate 12, and in addition forms an exposed portion 26 of substrate 12. A wet etchant such as hydrofluoric acid is preferably used to etch the exposed portion of the first buffer layer to form recess 24. Alternatively, the exposed portion of the first buffer layer may also be etched using other conventional isotropic etching techniques such as vapor etching or chemical downstream plasma etching.

Figure 4:
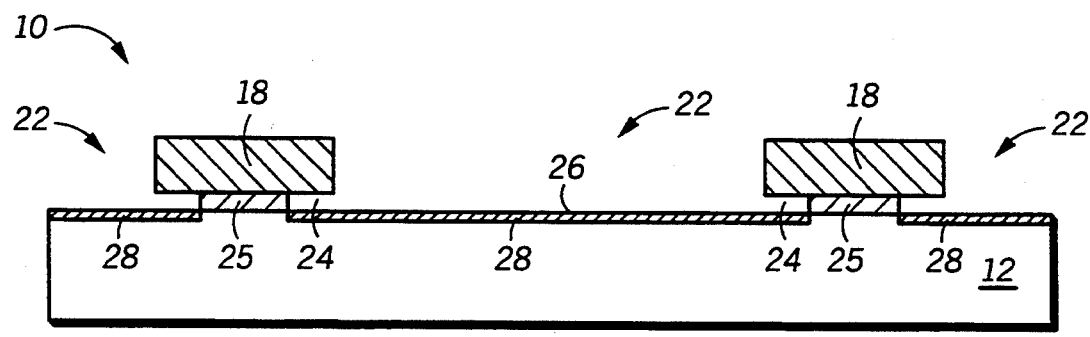

The process continues in FIG. 4 with the formation of a second buffer layer 28 overlying the exposed portion 26 of substrate 12. The second buffer layer 28 is preferably a silicon dioxide layer having a thickness of less than 25 nanometers, which is formed by thermally reoxidizing the exposed portion 26. Alternatively, the second buffer layer 28 may be a silicon nitride or silicon oxynitride layer, which is formed by nitriding exposed portion 26. For example, the silicon nitride or silicon oxynitride layers may be formed by rapid thermally annealing the exposed portion 26 in a nitrogen containing ambient such as ammonia or nitrous oxide. Alternatively, they may also be formed by furnace annealing exposed portion 26 in a nitrogen containing ambient such as ammonia or nitrous oxide.

Figure 5:
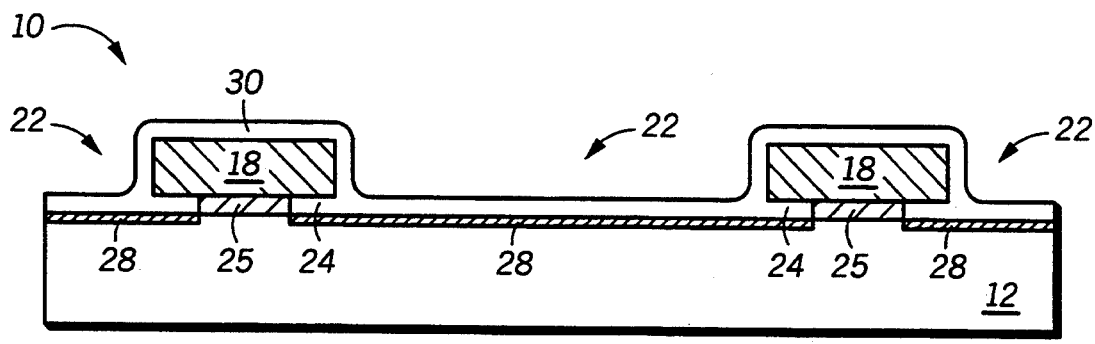

In FIG. 5, a nitride layer 30 is then formed overlying the remaining portion 18 and the second buffer layer 28. As shown in FIG. 5, the nitride layer 30 substantially fills the recesses 24. Nitride layer 30 is preferably a chemically vapor deposited silicon nitride layer with a thickness of less than 30 nanometers. Alternatively, nitride layer 30 may be a thin chemically vapor deposited oxynitride layer or a thin silicon dioxide layer that has been nitrided to form a nitride or oxynitride layer. For example, a thin layer of silicon dioxide may be deposited by chemical vapor deposition and then rapid thermally annealed in ammonia or nitrous oxide to form nitride layer 30. Additionally, nitride layer 30 may be plasma deposited silicon nitride or oxynitride.

Figure 6:
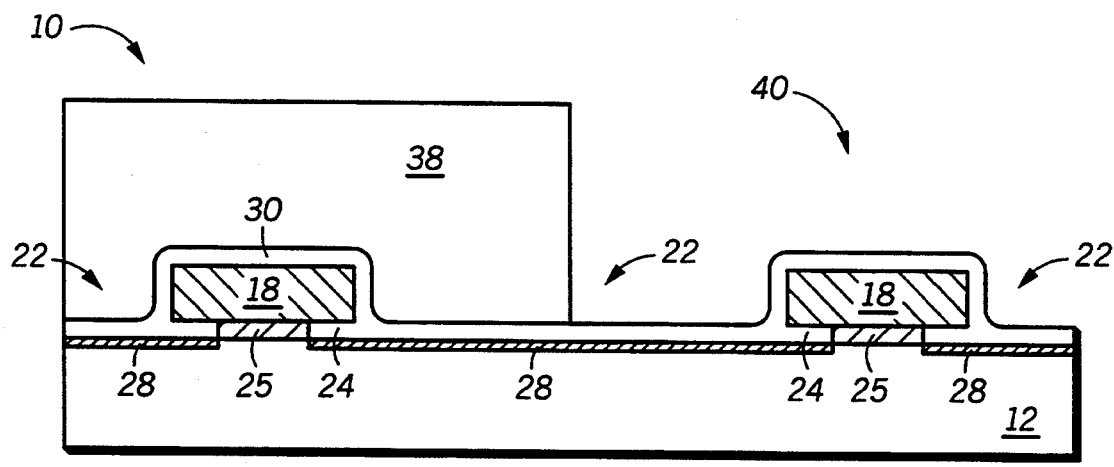

In FIG. 6, a second masking layer 38 is formed overlying the nitride layer 30, wherein the second masking layer 38 is patterned to expose a portion 40 of the nitride layer 30. The second masking layer 38 is preferably photoresist which can be deposited using conventional photoresist deposit techniques and then etched to expose the portion 40 of the nitride layer 30. The remaining portion of the second masking layer 38 represents a region which will contain a thinner field oxide isolation at the conclusion of the process. Region 40 not covered by photoresist represents an area which will contain a thicker field oxide isolation when the fabrication process has been completed. The function of having regions 38 and 40 will be more readily understood in the subsequent figures and discussion.

Figure 7:
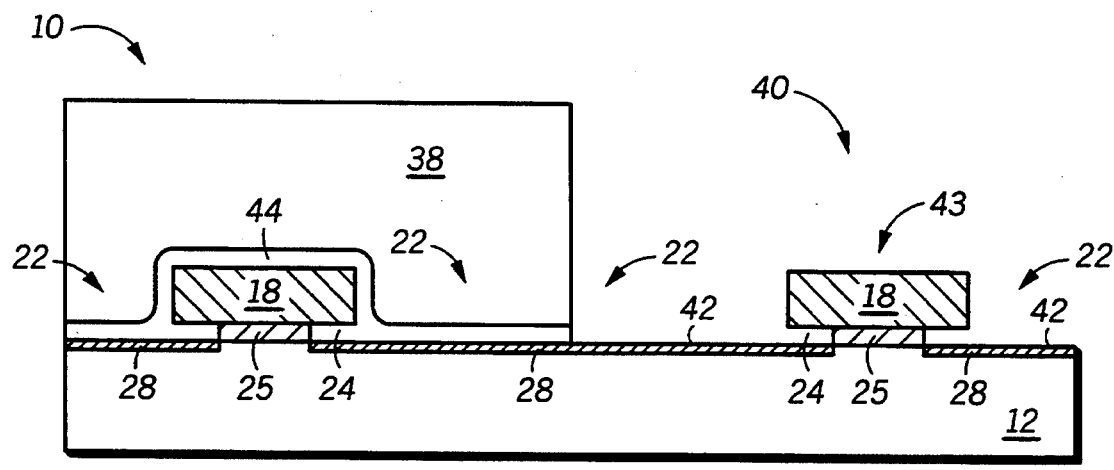

Illustrated in FIG. 7 is the next step in accordance with this embodiment of the invention. As shown, the exposed portion 40 of the nitride layer 30 is removed to form an exposed portion 42 of the second buffer layer 28 and to form an exposed portion 43 of the remaining portion of the first masking layer. A remaining portion 44 of the nitride layer remains protected by the second masking layer 38. The exposed portion 40 of the nitride layer can be removed by etching. Either an isotropic or anisotropic etch process can be used for etching nitride layer 30. An isotropic etching process uniformly etches in all directions, while an anisotropic etching process etches only in selective directions. Both etching processes are known in the art.

Figure 8:
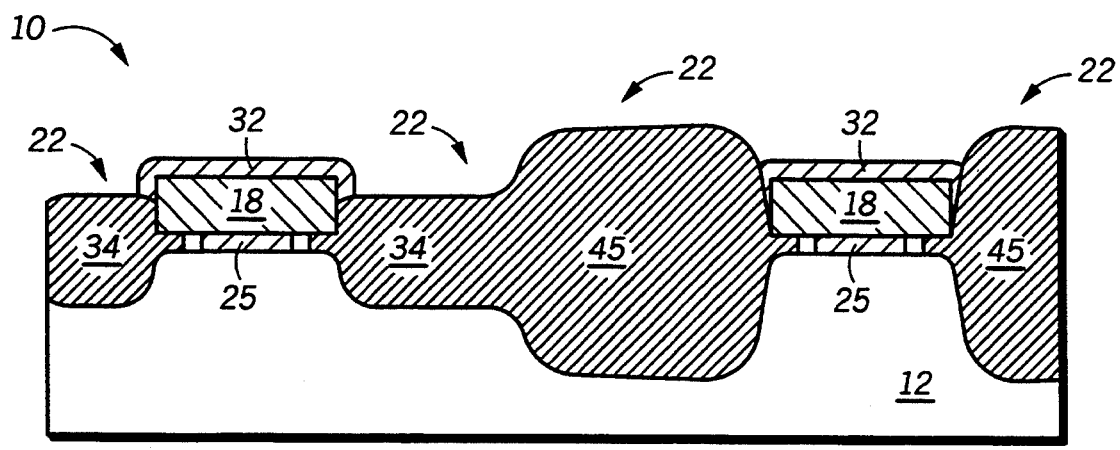

After the step of forming the exposed portion 42 of the second buffer layer 28, the second masking layer 38 is removed. In the case of a photoresist masking layer, a standard resist strip process can be used to remove the layer 38. A single thermal oxidation cycle is then performed to grow electrical isolation oxide within the isolation regions 22 of substrate 12. The remaining portion of the nitride layer, the exposed portion of the second buffer layer, and the exposed portion of the remaining portion of the first masking layer are oxidized to form an oxidized layer having dual field thicknesses: thinner isolation oxide 34 and thicker isolation oxide 45, as illustrated in FIG. 8. The thinner isolation oxide 34 resulted from a time-delay in the oxidation process due to the presence of remaining portion 44 of the nitride layer prior to field oxidation. The thicker isolation oxide 45 resulted from a relatively quick oxidation through the exposed portion 42 of the second buffer layer. Thus, by having different rates of oxidation across an isolation region, a dual field oxide can be manufactured in a single oxidation cycle. In a preferred embodiment, the remaining portion 44 of the nitride layer is 100 angstroms thick, which produces thinner field oxide isolation 34 of 5000 angstroms and thicker field oxide isolation 45 of 8000 angstroms.

Portions of oxidized layer 32, that overlie remaining portion 18, are then removed with hydrofluoric acid. Alternatively, other conventional dry or wet etching techniques may also be used to remove portions of oxidized layer 32. Remaining portion 18 is removed with phosphoric acid and remaining portion 25 is removed with hydrofluoric acid. Alternatively, other conventional dry or wet etching techniques may be used to remove remaining portion 18 or remaining portion 25.

Figure 9:
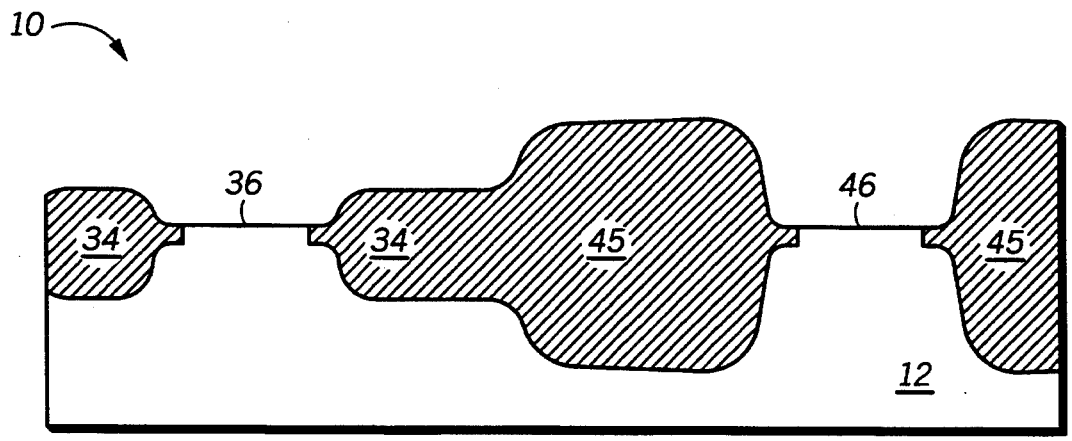

Semiconductor devices can then be formed in active regions 36 separated by thinner isolation oxide 34 or in active regions 46 separated by thicker isolation oxide 45, as illustrated in FIG. 9. Active regions 36 would suffer from lower field oxide encroachment as compared to active regions 46 because thin isolation oxide 34 is thinner than thick isolation oxide 45. However, higher voltage devices can be fabricated in active regions 46 because the thicker oxide 45 offers superior electrical isolation as compared to thinner oxide 34. As an example of one embodiment, low voltage and densely packed devices would be fabricated in active regions 36 while high voltage devices would be fabricated in active regions 46.

It is also possible to employ the aforementioned method in conjunction with standard LOCOS-based processes, where no undercutting of the first masking layer is involved. This process would follow the steps as previously discussed in FIGS. 1–2. After the first masking layer is patterned to leave a remaining portion of the first masking layer and to expose a portion of the buffer layer, then a conformal nitride layer is deposited over the entire surface, similar to that illustrated in FIG. 5. The second masking layer of photoresist is then formed overlying the nitride layer, and etched to expose a portion of the nitride layer, similar to that illustrated in FIG. 6. The exposed nitride portion is then removed so as to expose a portion of the buffer layer and a portion of the remaining portion of the first masking layer, analogous to that illustrated in FIG. 7. However, there are no cavities under the edges of the remaining portion of the first masking layer. By removing the exposed portion of the nitride layer, a different oxidation rate has been created for that region of the semiconductor substrate because nitride acts as a time delay during the oxidation cycle. Thus, it is possible to manufacture in any LOCOS-based processes a dual field oxide isolation structure in a integrated circuit on a semiconductor substrate in a single oxidation cycle by creating regions having different oxidation rates.

The foregoing description and illustrations contained herein demonstrate many of the advantages associated with the present invention. One advantage is the formation of dual field oxide thickness regions on the same wafer using only one field oxidation cycle. Practicing the present invention to manufacture dual field oxides on a same integrated circuit translates into substantial cost and time savings in the semiconductor wafer process. In addition, the aforementioned method represents an advanced LOCOS-based derivative and, hence, enables a scheme for fabricating dual field oxide with a method for obtaining reduced field oxide encroachment.

Thus it is apparent that there has been provided, in accordance with the invention, a method for forming dual field oxide isolation that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, substrate 12 could be trenched prior to the formation of buffer layer 28. Furthermore, although it is not shown in FIG. 2, buffer layer 20 may also be etched during the patterning process. Additionally, it should be known that silicon-rich oxynitride and silicon-rich silicon nitride could also be used for nitride layer 30. Altering the silicon concentration in these films is known to change their physical properties, such as film stress, and these physical characteristics could be optimized for the present invention. In addition, it is possible to extend the aforementioned method of forming dual field oxide regions on the same circuit of a semiconductor device to a LOCOS and any LOCOS-based derivative processes. Therefore, it is intended that this invention encompass all such variations and modifications falling within the scope of the appended claims.

We claim:

1. A method for forming a dual field thickness isolation structure in an integrated circuit device on a semiconductor substrate, comprising the steps of:
    forming a buffer layer overlying the substrate;
    forming a first masking layer overlying the buffer layer;
    patterning the first masking layer to form a first exposed portion of the buffer layer, to leave a remaining portion of the first masking layer, and to define an isolation region of the substrate;
    forming a nitride layer overlying the remaining portion of the first masking layer and the first exposed portion of the buffer layer;
    forming a second masking layer overlying a portion of the nitride layer, wherein the second masking layer is patterned to form an exposed portion of the nitride layer;
    removing the exposed portion of the nitride layer to form a second exposed portion of the buffer layer and to form an exposed portion of the remaining portion of the first masking layer, wherein a remaining portion of the nitride layer is protected by the second masking layer;
    removing the second masking layer after the step of removing the exposed portion of the nitride layer; and
    oxidizing through the remaining portion of the nitride layer and through the second exposed portion of the buffer layer to form an oxidized layer having the dual field thickness electrical isolation structure in the isolation region of the substrate.

2. The method of claim 1, wherein the step of forming a buffer layer comprises forming a layer selected from a group of materials consisting of: silicon dioxide and polycrystalline silicon.

3. The method of claim 1, wherein the step of forming a first masking layer comprises forming a silicon nitride layer.

4. The method of claim 1, wherein the step of forming a nitride layer comprises depositing a layer selected from a group of materials consisting of: silicon nitride and silicon oxynitride.

5. The method of claim 1, wherein the step of forming a nitride layer comprises the steps of:
    depositing a layer of silicon dioxide; and
    nitriding the layer of silicon dioxide to form the nitride layer.

6. The method of claim 1, wherein the step of forming a second masking layer comprises depositing a layer of photoresist.

7. A method for forming a dual field thickness isolation structure in an integrated circuit device on a semiconductor substrate, comprising the steps of:
    forming a first buffer layer overlying the substrate;
    forming a first masking layer overlying the first buffer layer;
    patterning the first masking layer to form an exposed portion of the first buffer layer, to leave a remaining portion of the first masking layer, and to define an isolation region of the substrate;
    etching the exposed portion of the first buffer layer to form a recess under an edge portion of the remaining portion of the first masking layer, to form an exposed portion of the semiconductor substrate, and to leave a remaining portion of the first buffer layer overlying the substrate;
    forming a second buffer layer overlying the exposed portion of the substrate;
    forming a nitride layer overlying the remaining portion of the first masking layer and the second buffer layer;
    forming a second masking layer overlying a portion of the nitride layer, wherein the second masking layer is patterned to form an exposed portion of the nitride layer;

removing the exposed portion of the nitride layer to leave a remaining portion of the nitride layer, to form an exposed portion of the second buffer layer, and to form an exposed portion of the remaining portion of the first masking layer;

removing the second masking layer after the step of removing the exposed portion of the nitride layer; and oxidizing through the remaining portion of the nitride layer and through the exposed portion of the second buffer layer and the exposed portion of the remaining portion of the first masking layer to form an oxidized layer having the dual field thickness electrical isolation structure in the isolation region of the substrate.

8. The method of claim 7 wherein the step of forming a second buffer layer comprises reoxidizing the exposed portion of the substrate.

9. The method of claim 7, wherein the step of forming a second buffer layer comprises forming a layer selected from a group of materials consisting of: silicon dioxide, silicon nitride, and silicon oxynitride.

10. The method of claim 7, wherein the step of forming a nitride layer comprises forming a layer selected from a group of materials consisting of: silicon nitride and silicon oxynitride.

11. The method of claim 7, wherein the step of forming a nitride layer comprises the steps of:
depositing a layer of silicon dioxide; and
nitriding the layer of silicon dioxide to form the nitride layer.

12. The method of claim 7, further comprising the steps of:
removing the remaining portion of the first masking layer; and
removing the remaining portion of the first buffer layer.

13. The method of claim 7, wherein the step of forming a second masking layer comprises depositing a layer of photoresist.

14. A method for forming a dual field thickness isolation structure in an integrated circuit device on a semiconductor substrate comprising the steps of:
forming a buffer layer overlying the substrate;
forming a first silicon nitride layer overlying the buffer layer;
patterning the first silicon nitride layer to form a first exposed portion of the buffer layer, to leave a remaining portion of the first silicon nitride layer, and to define an isolation region of the substrate;
depositing a second silicon nitride layer overlying the remaining portion of the first silicon nitride layer and the first exposed portion of the buffer layer;
depositing a photoresist layer overlying a portion of the second silicon nitride layer;
patterning the photoresist layer to form an exposed portion of the second silicon nitride layer and to leave a patterned photoresist layer;
etching the exposed portion of the second silicon nitride layer to form an exposed portion of the remaining portion of the first silicon nitride layer and to form a second exposed portion of the buffer layer, wherein a remaining portion of the second silicon nitride layer is protected by the patterned photoresist layer;
etching the patterned photoresist layer; and
oxidizing through the remaining portion of the second silicon nitride layer and through the second exposed portion of the buffer layer to form an oxidized layer having the dual field thickness isolation structure in the isolation region of the substrate.

15. The method of claim 14, wherein the step of forming a buffer layer comprises forming a layer selected from a group of materials consisting of: silicon dioxide and polycrystalline silicon.

16. The method of claim 14, wherein the step of depositing a second silicon nitride layer is further characterized as depositing the silicon nitride layer with a thickness of less than 30 nanometers.

17. The method of claim 14, further comprising the steps of:
removing the remaining portion of the first silicon nitride layer; and
removing the buffer layer.

18. A method for forming a dual field thickness isolation structure in an integrated circuit device on a semiconductor substrate comprising the steps of:
forming a silicon dioxide layer overlying the substrate;
forming a first silicon nitride layer overlying the silicon dioxide layer;
patterning the first silicon nitride layer to form a first exposed portion of the silicon dioxide layer, to leave a remaining portion of the first silicon nitride layer, and to define an isolation region of the substrate;
etching the exposed portion of the silicon dioxide layer to form a recess under an edge portion of the remaining portion of the first silicon nitride layer, to form an exposed portion of the substrate, and to leave a remaining portion of the silicon dioxide layer overlying the substrate;
forming a buffer layer having a thickness of less than 30 nanometers overlying the exposed portion of the substrate;
depositing a second silicon nitride layer overlying the remaining portion of the first silicon nitride layer and the buffer layer;
depositing a photoresist layer overlying a portion of the second silicon nitride layer;
patterning the photoresist layer to form an exposed portion of the second silicon nitride layer and to leave a patterned photoresist layer;
etching the exposed portion of the second silicon nitride layer to leave a remaining portion of the second silicon nitride layer, to form an exposed portion of the remaining portion of the first silicon nitride layer, and to form an exposed portion of the buffer layer;
etching the patterned photoresist layer; and
oxidizing through the remaining portion of the second silicon nitride layer and through the exposed portion of the buffer layer and the exposed portion of the remaining portion of the first silicon nitride layer to form an oxidized layer having a dual field thickness which forms electrical isolation in the isolation region of the substrate.

19. The method of claim 18, wherein the step of forming a buffer layer comprises a process selected from a group consisting of:
reoxidizing the exposed portion of the substrate; and
nitriding the exposed portion of the substrate.

20. The method of claim 18, further comprising the steps of:
removing the remaining portion of the first silicon nitride layer; and
removing the remaining portion of the silicon dioxide layer.

* * * * *